United States Patent
Lee

(10) Patent No.: US 7,675,438 B2
(45) Date of Patent: Mar. 9, 2010

(54) METHOD AND SYSTEM FOR TRANSMITTING/RECEIVING SERIAL DATA IN SERIAL COMMUNICATION SYSTEM AND SERIAL COMMUNICATION SYSTEM FOR THE SAME

(75) Inventor: Kang-Min Lee, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 12/021,730

(22) Filed: Jan. 29, 2008

(65) Prior Publication Data

US 2008/0180288 A1 Jul. 31, 2008

(30) Foreign Application Priority Data

Jan. 29, 2007 (KR) .................. 10-2007-0008889

(51) Int. Cl.
*H03M 9/00* (2006.01)
(52) U.S. Cl. ....................... 341/100; 341/101
(58) Field of Classification Search ........... 341/100, 341/101, 50, 51
See application file for complete search history.

(56) References Cited

U.S. PATENT DOCUMENTS

| 5,654,703 | A * | 8/1997 | Clark, II ................... 341/51 |
| 6,256,652 | B1 * | 7/2001 | Saperov et al. ............. 708/203 |
| 6,425,107 | B1 * | 7/2002 | Caldara et al. ............. 714/759 |
| 6,653,957 | B1 * | 11/2003 | Patterson et al. ........... 341/100 |
| 6,950,889 | B2 * | 9/2005 | Ishida et al. ............... 710/65 |
| 7,047,332 | B2 * | 5/2006 | Ishida et al. ............... 710/65 |
| 2004/0108945 | A1 * | 6/2004 | Hori .......................... 341/63 |
| 2006/0013291 | A1 | 1/2006 | Hashimoto et al. |
| 2006/0192700 | A1 * | 8/2006 | Hori ......................... 341/100 |

FOREIGN PATENT DOCUMENTS

| JP | 04-144325 | 5/1992 |
| JP | 2000-092255 | 3/2000 |
| KR | 100140341 | 3/1998 |
| KR | 100164101 | 9/1998 |

OTHER PUBLICATIONS

Kangmin Lee et al.; "SILENT: Serialized Low Energy Transmission Coding for On-Chip Interconnection Networks", IEEE 2004, pp. 448-451.

* cited by examiner

*Primary Examiner*—Jean B Jeanglaude
(74) *Attorney, Agent, or Firm*—The Farrell Law Firm, LLP

(57) ABSTRACT

A method and a system for transmitting/receiving serial data efficiently by minimizing the transitions of bits in a serial communication system, as well as a serial communication system for the same, are provided. The method for converting coded parallel data into serial data and transmitting the serial data in a serial communication system includes determining a position, in which an information bit of the coded parallel data is found first, the information bit being defined as a bit having a predetermined bit value so that the information bit is not compressed; and serially transmitting the information bit found first and at least one bit following the information bit found first as compressed serial data until the determined position is reached.

21 Claims, 11 Drawing Sheets

METHOD AND SYSTEM FOR TRANSMITTING/RECEIVING SERIAL DATA IN SERIAL COMMUNICATION SYSTEM AND SERIAL COMMUNICATION SYSTEM FOR THE SAME

PRIORITY

This application claims priority to an application entitled "Method and System for Transmitting/Receiving Serial Data in Serial Communication System and Serial Communication System for the Same" filed with the Korean Intellectual Property Office on Jan. 29, 2007 and assigned Serial No. 2007-008889, the contents of which are incorporated herein by reference.

BACKGROUND OF THE INVENTION

1. Field of the Invention

The present invention relates to a method for transmitting/receiving serial data in a serial communication system, as well as a serial communication system for the same. More particularly, the present invention relates to a method and a system for transmitting/receiving serial data efficiently by minimizing the transitions of bits in a serial communication system, as well as a serial communication system for the same.

2. Description of the Related Art

As generally known in the art, conventional on-chip or off-chip parallel communication systems require a large number of wires, which result in problems including crosstalk between wires, skew, etc. Therefore, off-chip serial communication systems (e.g. Ethernet, USB (Universal Serial Bus), IEEE 1394, PCI-EXPRESS, etc.) are used for wired communication between electric products, Internet communication between computers, communication between functional blocks inside chips, etc. Even in the case of on-chip communication systems, which have adopted only the parallel bus scheme, on-chip serial communication systems are being studied to solve not only the above-mentioned problems of crosstalk between wires and skew, but also the wiring congestion of parallel wires. Such an on-chip serial communication scheme has been adopted for a multifunction, high-performance multicore SoC (System-on-Chip), such as an NoC (Network-on-Chip).

FIG. 1 is a block diagram showing an apparatus for transmitting/receiving serial data according to the prior art.

The conventional serial communication system includes a transmitter 110 for converting input N-bit parallel data 101 into serial data 105 and transmitting it, and a receiver 150 for receiving the serial data from the transmitter 110 and converting it into N-bit parallel data 109.

The transmitter 110 successively converts N-bit parallel data 101, which is stored in a first signal processor 111 of a FIFO (First In First Out) type, into serial data 105 through a serial converter 115, and loads the serial data 105 onto a serial transmission wire 130. The MSB (Most Significant Bit) of the serial data 105 is generally transmitted first.

The receiver 150 converts the successively inputted serial data 105 into parallel data through a parallel converter 151, stores the parallel data in a second signal processor 155, and outputs N-bit parallel data 109.

The first and second signal processors 111 and 155 according to the prior art shown in FIG. 1 may be omitted, and a coder 113 and a decoder 153 may be added if a separate coding scheme is adopted.

Coding schemes applicable to the coder 113 and the decoder 153 shown in FIG. 1 will now be described.

When clocks are extracted from data without separate clock signals, such as in the case of Ethernet (IEEE 802.3), DC-balanced codes (e.g. 8 B/10 B codes) are used. Particularly, according to the DC-balanced coding scheme, transitions are so created in the serial transmission wire 130 that less than five consecutive symbols (0 or 1) should occur. This makes it easier to extract clocks from the serial transmission wire 130.

However, the DC-balanced coding scheme increases the transmitting/receiving power due to the increased number of transitions in the serial transmission wire 130. In addition, 25% overhead occurs because, in order to transmit effective data of 8 bits 10 bits are actually transmitted. The DC-balanced coding scheme is even unnecessary if separate clock signals are used or if the transmitter 110 and the receiver 150 are synchronized as in the case of on-chip communication systems.

There are analog and digital methods for minimizing the transmitting/receiving power when the transmitter 110 and the receiver 150 are synchronized. The analog method includes a low-swing signaling scheme, according to which the signal level is lowered. The digital method includes a scheme (e.g. SILENT coding scheme), according to which the bit transitions on the serial transmission wire 130 are minimized.

The SILENT coding scheme, which has been studied as one of the conventional digital methods, applies XOR (Exclusive OR) codes to the serial transmission scheme, as disclosed in "SILENT: Serialized Low Energy Transition Coding for On-Chip Interconnection Networks", Kangmin Lee, et al., IEEE ICCAD 2004, pp. 448-451.

FIG. 2 shows a SILENT coding scheme.

The scheme will now be described with reference to FIG. 1 on an assumption that N-bit parallel data is 8-bit data.

The first signal processor 111 shown in FIG. 2 is a buffer of an FIFO type, and transmits successively inputted parallel data W0-W3 to the coder 113. The coder 113 adopts a SILENT coding scheme, which applies XOR codes to a serial transmission scheme, and creates data W'0-W'3 201 that has been coded successively in such a manner that, if a currently transmitted data bit is identical to a previously transmitted data bit, 0 is used, and, if they are different, 1 is used. The serial converter 115 serializes the created data 203, and loads the SILENT-coded serial data 205 onto the serial transmission wire 130 as shown in FIG. 2A.

It is clear from FIG. 2 that, as a result of applying the SILENT coding scheme, there are 6 bit transitions in the SILENT-coded serial data 205 as shown in FIG. 2A, but there are 17 bit transitions in the original serial data 207 to which the SILENT coding has not been applied. The reason the number of bit transitions is reduced by the SILENT coding is that there exists locality between the consecutive parallel data.

However, when such SILENT coding is applied to a serial communication system, the power is reduced efficiently compared with conventional methods applying no coding, while the bit rate has no gain. In other words, even if the SILENT coding is applied to a serial communication system for conversion into serial data, neither the bit rate nor the bandwidth can be increased during serial data transmission.

In addition, serial transmission schemes adopted by serial communication systems employ a small number of transmission wires and, therefore, have a much smaller bandwidth than parallel transmission schemes which employ many transmission wires to transmit a number of bits simultaneously. In an attempt to solve the problem of small transmission bandwidth, the bit rate is increased by a number of times. This results in difficulty in high-speed design, as well as problems related to the area and power resulting from high-speed circuits.

Therefore, there is a need for a scheme capable of increasing the available bandwidth by compressing SILENT-coded data so that the transitions of bits in serial communication systems can be minimized.

SUMMARY OF THE INVENTION

Accordingly, the present invention has been made to solve the above-mentioned problems occurring in the prior art, and it is an aspect of the present invention to provide a method and a system for transmitting/receiving serial data efficiently by minimizing the transitions of bits in a serial communication system, as well as a serial communication system for the same.

It is another aspect of the present invention to provide a method and a system for transmitting/receiving serial data in a serial communication system by compressing coded data so that the available bandwidth increases, as well as a serial communication system for the same.

In order to accomplish these aspects of the present invention, there is provided a method for converting coded parallel data into serial data and transmitting the serial data in a serial communication system, the method including determining a position, an information bit of the coded parallel data being found first in the position, the information bit being defined as a bit having a predetermined bit value so that the information bit is not compressed; and serially transmitting the information bit found first and at least one bit following the information bit found first as compressed serial data until the determined position is reached.

In accordance with another aspect of the present invention, there is provided a method for converting serial data into coded parallel data and receiving the coded parallel data in a serial communication system, the method including receiving each bit of compressed serial data until a signal indicating an end of the compressed serial data is inputted; and outputting the coded parallel data including each received data and at least one bit following each received data, the bit having a predetermined bit value.

In accordance with a further aspect of the present invention, there is provided an apparatus for converting coded parallel data into serial data and transmitting the serial data in a serial communication system, the apparatus including a compressor for outputting a count while increasing the count until a position is reached, an information bit of the coded parallel data being found first in the position, the information bit being defined as a bit having a predetermined bit value so that the information bit is not compressed, the compressor transmitting a signal indicating an end of compressed serial data when the position is reached; and a serial converter for serially transmitting a bit of the coded parallel data as the compressed serial data, the bit corresponding to a position indicated by the outputted count.

In accordance with a still further aspect of the present invention, there is provided an apparatus for converting serial data into coded parallel data and receiving the coded parallel data in a serial communication system, the apparatus including a decompressor for outputting a count while increasing the count until a signal indicating an end of compressed serial data is inputted; and a parallel converter having a plurality of latches pre-storing predetermined bit values, the parallel converter receiving each bit of the compressed serial data and storing a bit corresponding to the outputted count in a corresponding latch, the parallel converter outputting bits stored in the latches as the coded parallel data when a signal indicating an end of the compressed serial data is inputted.

In accordance with a yet further aspect of the present invention, there is provided a serial communication system for converting coded parallel data into serial data and transmitting/receiving the serial data, the system including a serial data transmitting apparatus for outputting a first count while increasing the first count until a position is reached, an information bit of the coded parallel data being found first in the position, the information bit being defined as a bit having a predetermined bit value so that the information bit is not compressed, the serial data transmitting apparatus transmitting a signal indicating an end of compressed serial data when the position is reached, the serial data transmitting apparatus serially transmitting a bit of the coded parallel data as the compressed serial data, the bit corresponding to a position indicated by the outputted first count; and a serial data receiving apparatus for outputting a second count while increasing the second count until a signal indicating an end of the compressed serial data is inputted, the serial data receiving apparatus having a plurality of latches having predetermined bit values, the serial data receiving apparatus receiving each bit of the compressed serial data and storing a bit corresponding to the second count in a corresponding latch, the serial data receiving apparatus outputting bits stored in the latches as the coded parallel data when a signal indicating an end of the compressed serial data is inputted.

BRIEF DESCRIPTION OF THE DRAWINGS

The above and other exemplary features, aspects, and advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described in detail with reference to the accompanying drawings. In the following description of the present invention, a detailed description of known functions and configurations incorporated herein is omitted to avoid making the subject matter of the present invention unclear. The terminology used herein is defined based on consideration of relevant functionality according to the present invention, and may vary depending on the intention or practice of the user or operator. Therefore, the definition must be understood based on the overall context of the specification.

The basic concept of the present invention will now be described. According to the present invention, coded parallel data is converted into compressed serial data in such a manner that, if a bit of the coded parallel data has no difference from the corresponding bit of previously transmitted data, the bit ("an identical bit",) is removed. In other words, identical bits are removed from parallel data, which is compressed and converted into serial data so that the amount of data to be transmitted/received is reduced. This shortens the time necessary to transmit/receive the serial data and improves the available bandwidth of the actual transmission wire.

In order to compress bits which have no difference from previously transmitted parallel data, the coding scheme and bits not to be compressed must be determined during the initial setting of the serial communication system.

An embodiment of the present invention will now be described on an assumption that, during the initial setting of a serial communication system, SILENT coding is applied to a coder and a decoder and that, '0' bits of the SILENT-coded parallel data are bits to be compressed, while '1' bits are bits not to be compressed ( "information bits").

Figure 1:
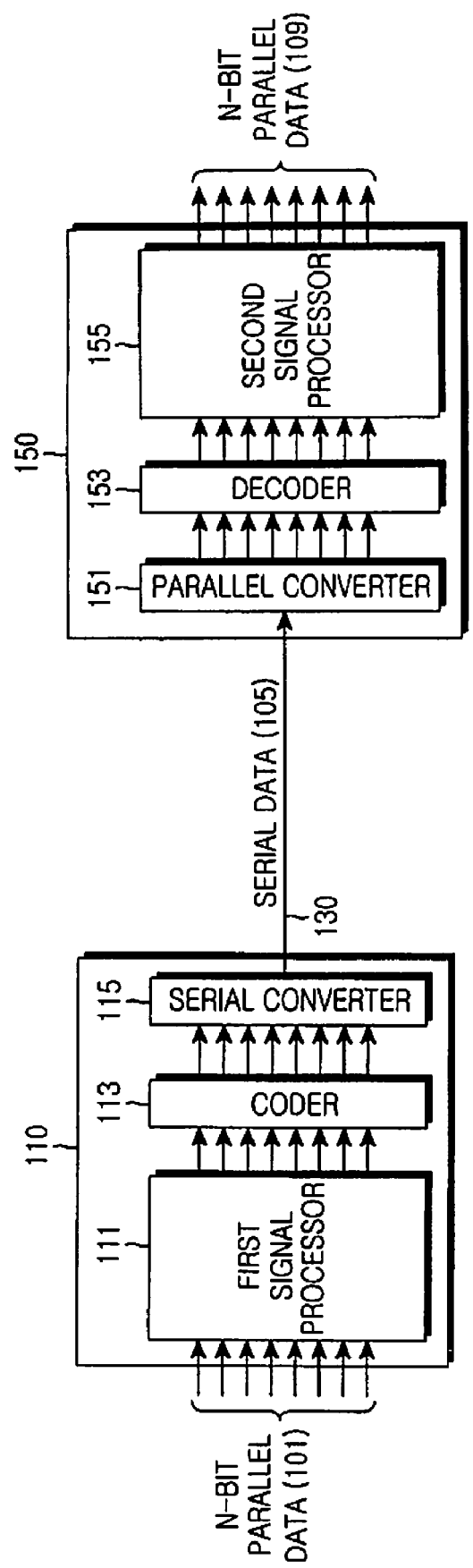
FIG. 1 is a block diagram showing an apparatus for transmitting/receiving serial data according to the prior art.
Figure 2:
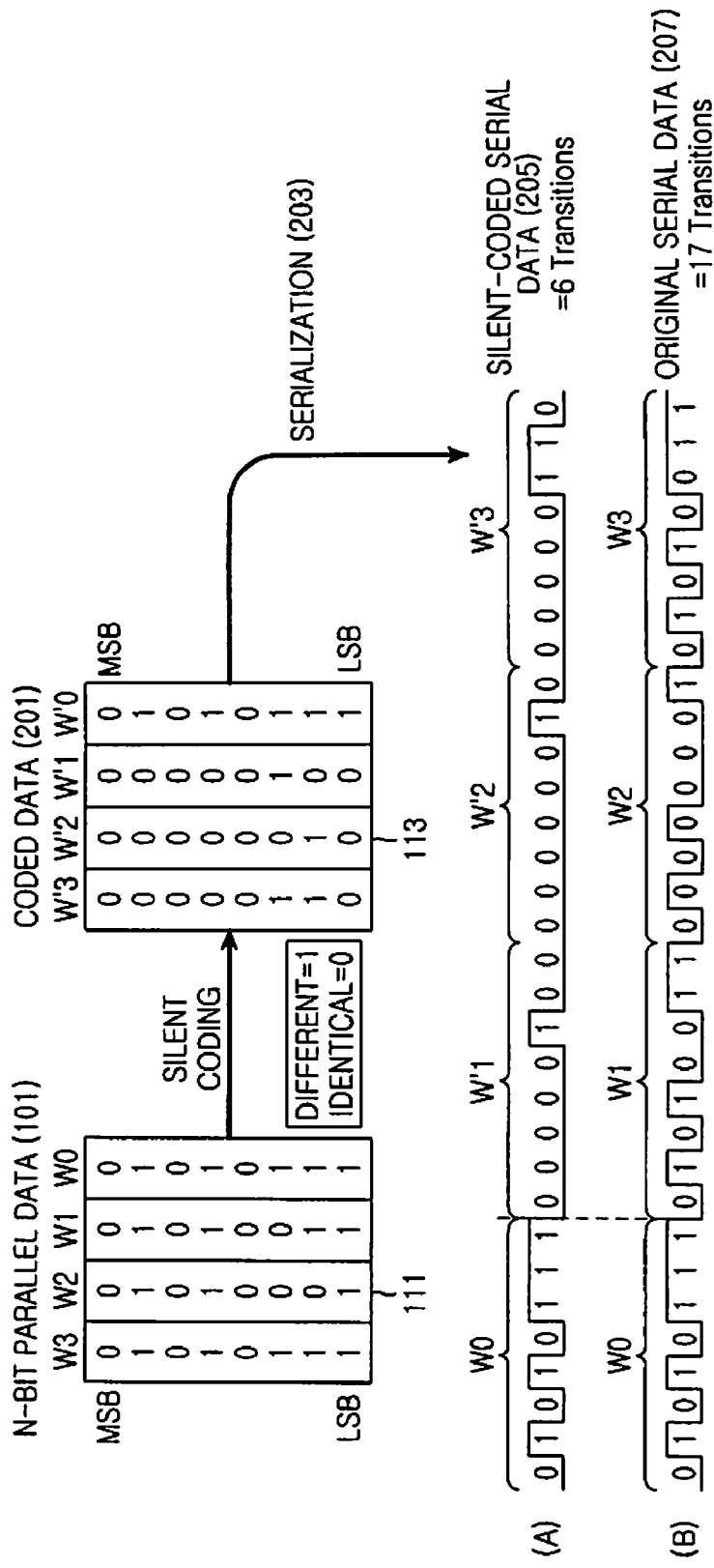
FIG. 2 shows a SILENT coding scheme.
Figure 3:
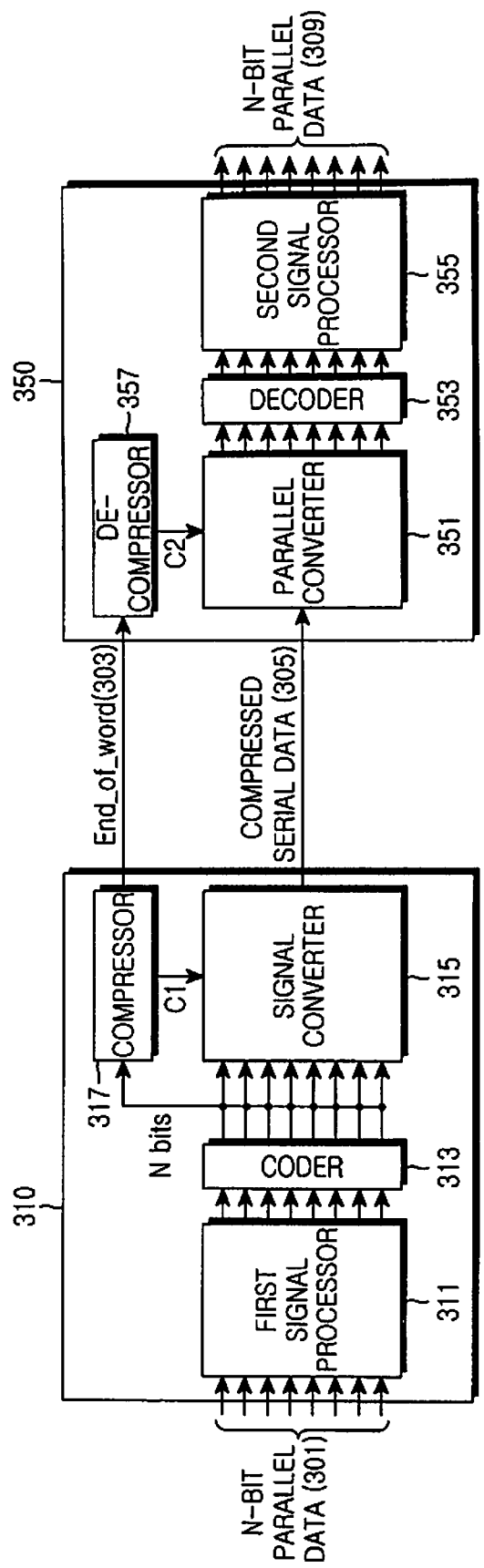
FIG. 3 is a block diagram showing an apparatus for transmitting/receiving compressed serial data according to an embodiment of the present invention.

FIG. 3 is a block diagram showing an apparatus for transmitting/receiving compressed serial data according to an embodiment of the present invention.

Referring to FIG. 3, the serial communication system includes a transmitter 310 for applying a SILENT coding scheme to inputted N-bit parallel data 301 to convert it into compressed serial 305, and a receiver 350 for receiving the compressed serial data 305, decomposing it, and applying a SILENT decoding scheme to it so that it is decoded into initially inputted N-bit parallel data 309.

The transmitter 310 includes a first signal processor 311, a coder 313, a serial converter 315 and a compressor 317. The receiver 350 includes a parallel converter 351, a decoder 353, a second signal processor 355 and a decompressor 357.

The first and second signal processors 311 and 355, as well as the coder 313 and the decoder 353 of the transmitter 310 and the receiver 350, respectively, are operated in the same manner as in the case of the prior art, and detailed description thereof will be omitted herein.

The compressor 317 of the transmitter 310 shown in FIG. 3 receives coded parallel data from the coder 313 as an input and outputs a serial conversion control signal C1 and a signal 303 for indicating the end of the compressed serial data 305 ( "end_of_word",). The end_of_word 303 includes [HIGH] and [LOW] signals. It will be assumed in the following description that, if the end_of_word 303 is a [HIGH] signal, it indicates the end of the compressed serial data 305. The compressor 317 will be described later in more detail with reference to FIG. 4.

Figure 5:
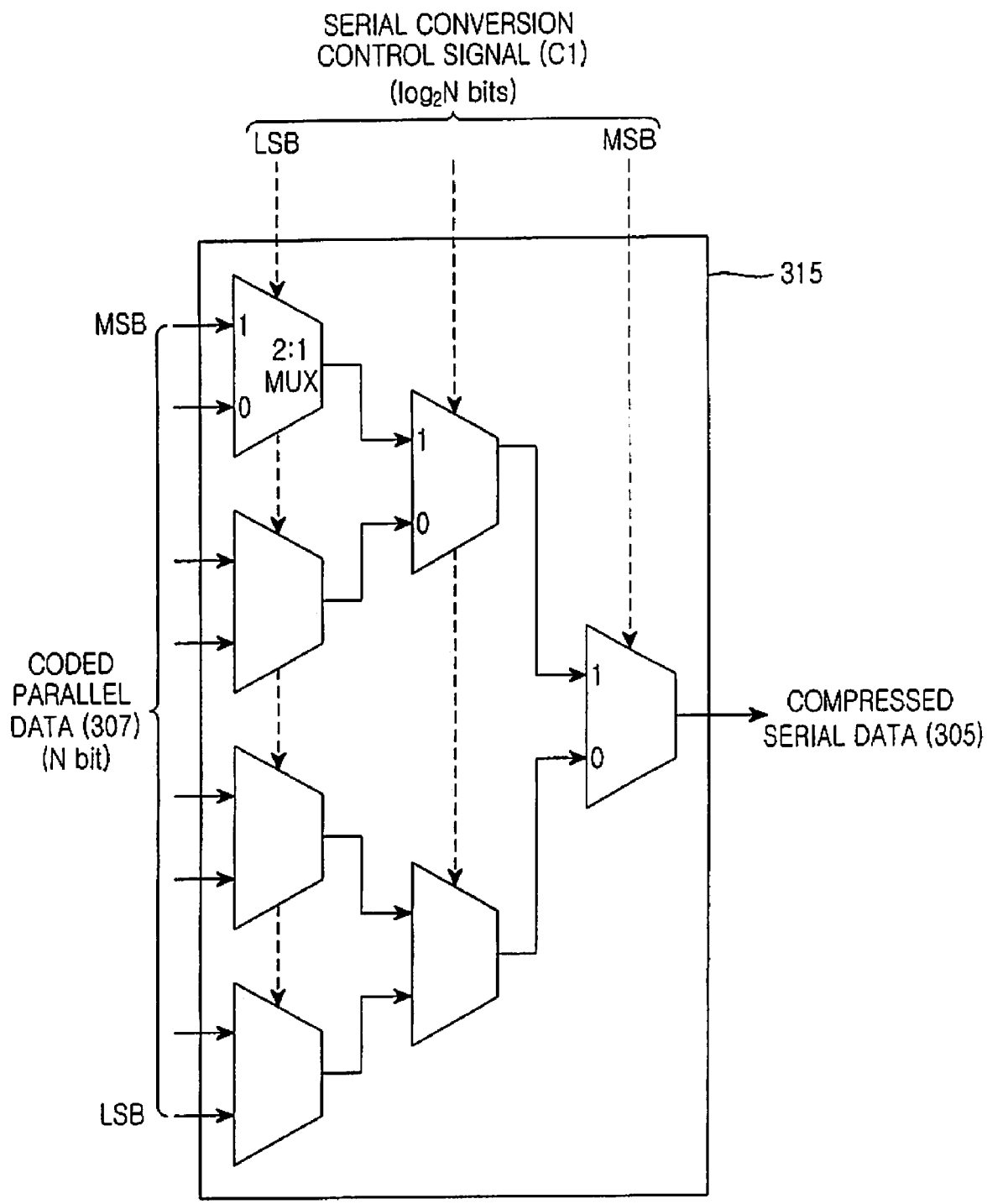
FIG. 5 is a block diagram showing in detail a serial converter included in the transmitter shown in FIG. 3.

The serial converter 315 converts the coded parallel data into the serial data 305 by using the serial conversion control signal C1. The serial converter 315 may be implemented as shown in FIG. 5 by using a multistage multiplexer.

Figure 6:
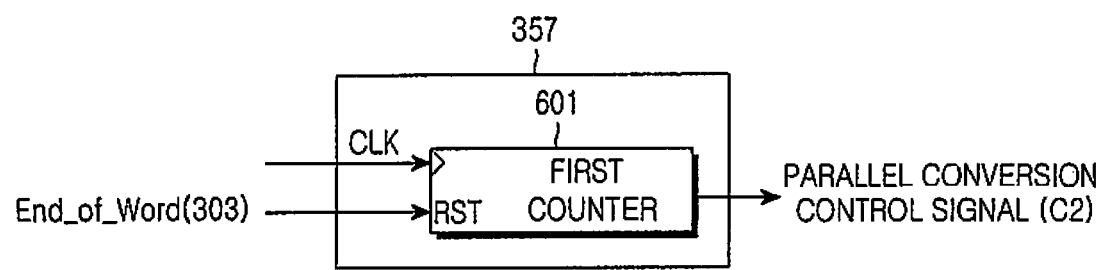
FIG. 6 is a block diagram showing in detail a decompressor included in a receiver shown in FIG. 3.

The decompressor 357 of the receiver 350 outputs a parallel conversion control signal C2 by using the input of the end_of_word 303. The decompressor 357 may be implemented as shown in FIG. 6 by using a first counter 601, and will be described later in more detail with reference to FIG. 6.

Figure 7:
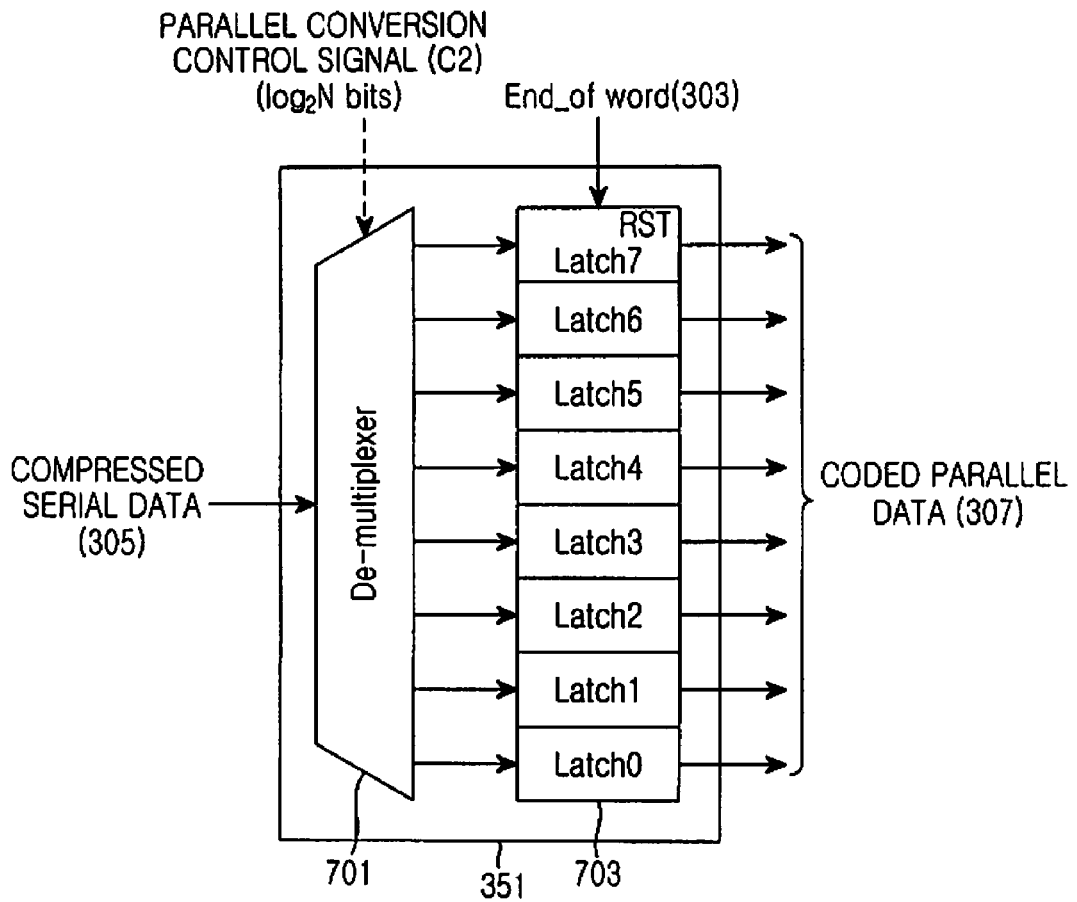
FIG. 7 is a block diagram showing in detail a parallel converter included in the receiver shown in FIG. 3.

The parallel converter 351 converts the transmitted and compressed serial data 305 into coded parallel data by using the parallel conversion control signal C2, and may be implemented as shown in FIG. 7 by using a demultiplexer 701 and a plurality of latches 703.

Figure 4:
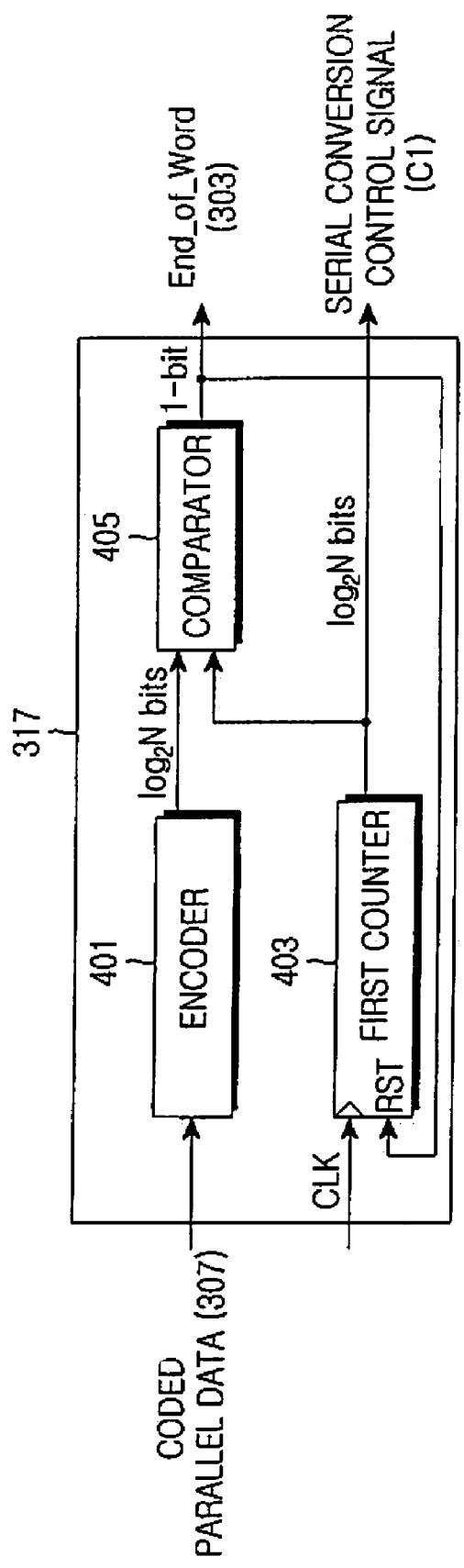
FIG. 4 is a block diagram showing in detail a compressor included in a transmitter shown in FIG. 3.

FIG. 4 is a block diagram showing in detail the compressor 317 shown in FIG. 3.

The compressor 317, according to an embodiment of the present invention, is implemented by a logic circuit, and includes an encoder 401, a first counter 403 and a comparator 405.

The encoder 401 shown in FIG. 4 receives coded parallel data 307 as an input and scans each bit to determine the position in which the first information bit '1' is found. The scanning of each bit by the encoder 401 to find the information bit starts from either the Most Significant Bit (MSB) or the Least Significant Bit (LSB). However, it is to be noted that, when multimedia contents or digital signals are processed, upper bits do not undergo rapid transitions very often, and that, since the addresses increase one after another during memory processing, the transition between previously transmitted data and currently transmitted data mainly occurs in lower bits. This means that upper bits need to be compressed more frequently. Therefore, it will be assumed in the following description that the scanning starts from the MSB. For example, when 8-bit coded parallel data 307 inputted to the encoder 401 is [00000100], the encoder 401 starts the scanning from the MSB and finds the first information bit '1' in the position of the $2^{nd}$ pit (the counting begins from the $0^{th}$ bit). Therefore, [010] is outputted as the position of the first bit.

The first counter 403 of the compressor 317 outputs a count, which increases from 0 by 1, to the comparator 405 and as the serial conversion control signal C1. It will be assumed that, unless otherwise indicated, the count is outputted by the first counter 403.

When the first counter 403 receives a [HIGH] signal from the comparator 405, it resets the count. For example, if the count increases from [000] to [010] by 1 and if the first counter 403 receives a [HIGH] signal from the comparator 405, the first counter 403 outputs [000→001→010→reset] to the comparator 405 and as serial conversion control signal C1.

If the position of the first information bit found is identical to the count inputted from the first counter 403, the comparator 405 transmits a [HIGH] signal (1 bit) to the first counter 403, and transmits a clock having a [HIGH] signal to the end_of_word 303. For example, if the position of the first information bit found is [010] and if the count inputted from the first counter 403 is [010], the comparator 405 transmits a [HIGH] signal to the first counter 403, and transmits a clock having a [HIGH] clock to the end_of_word 303. On the other hand, if the position of the first information bit found is different from the count input from the first counter 403, the comparator 405 outputs a [LOW] signal to the end_of_word 303.

FIG. 5 is a block diagram showing in detail the serial converter included in the transmitter 310 shown in FIG. 3.

Referring to FIG. 5, the serial converter 315 may be implemented by using a plurality of multiplexers depending on the number of bits of the coded parallel data 307. The serial converter 315 receives coded parallel data 307 from the coder 313 and outputs a bit, which corresponds to the position indicated by the count, based on the serial conversion control signal C1 outputted by the first counter 403. For example, if data inputted to the serial converter 315 is [00000100] and if the serial conversion control signal C1 outputted by the first counter 403 while increasing by 1 is [000], the serial converter 315 outputs the $0^{th}$ bit of the serial data 305, i.e. [0]. If the serial conversion control signal C1 is [010], the serial converter 315 outputs the $1^{st}$ data of the serial data 305, i.e. [0]. If the serial conversion control signal C1 is [010], the serial converter 315 outputs the $2^{nd}$ bit of the serial data 305, i.e. [1].

FIG. 6 is a block diagram showing in detail the decompressor included in the receiver shown in FIG. 3.

Referring to FIG. 6, when compressed serial data 305 is inputted to the receiver 350, the second counter 601 of the decompressor 357 outputs a parallel conversion control signal C2, which increases from 0 by 1. Upon receiving a [HIGH] signal as the end_of_word 303, the second counter 601 does not increase the count but resets it. This means that the second counter 601 conducts the same operation as the first counter 403 of the compressor 317. For example, if the count increases from [000] to [010] by 1 and if a [HIGH] signal is inputted as the end_of_word 303, the second counter 601 outputs [000→001→010→reset] as the parallel conversion control signal C2.

FIG. 7 is a block diagram showing in detail the parallel converter included in the receiver shown in FIG. 3.

Referring to FIG. 7, the parallel converter 351 includes a demultiplexer 701 and a plurality of latches 703. The demultiplexer 701 of the parallel converter 351 receives compressed serial data 305 from the transmitter 110 and outputs respective bits to corresponding latches based on the parallel conversion control signal C2. Assuming that the compressed serial data 305 inputted to the demultiplexer 701 is [00000100], if the parallel conversion control signal C2 is [000], the $0^{th}$ bit of the compressed serial data 305, i.e. [0], is outputted to the latch 0; if the parallel conversion control signal C2 is [001], the $1^{st}$ bit of the compressed serial data 305, i.e. [0], is outputted to the latch 1; and, if the parallel conversion control signal C2 is [010], the $2^{nd}$ bit of the compressed serial data 305, i.e. [1], is outputted to the latch 2.

The number of the latches 703 is the same as that of bits outputted by the demultiplexer 701 so that the latches 703 are reset by the initial end_of_word 303 before respective bits are inputted. Respective bits outputted by the demultiplexer 701 are stored in the corresponding latches 703. If no bit is outputted to one of the latches 703 according to the parallel conversion control signal C2, the corresponding latch stores [0] as the initial reset. For example, if [0] is outputted to the latch 0 as the $0^{th}$ bit of the compressed serial data 305, [0] is stored in the latch 0; if [0] is outputted to the latch 1 as the $1^{st}$ bit of the compressed serial data 305, [0] is stored in the latch 1; and, if [1] is outputted to the latch 2 as the $2^{nd}$ bit of the compressed serial data 305, [1] is stored in the latch 2. If no bits are outputted to the latches 3-7, they store [0] as the initial reset. Meanwhile, if '1' and '0' bits of the coded parallel data have been set as the compression and information bits, respectively, during the initial setting of the serial communication system, [1] must be set as the initial reset.

As such, the parallel converter 351 including a demultiplexer 701 and a plurality of latches 703 converts compressed serial data 305 into N-bit coded parallel data 307.

Figure 8:
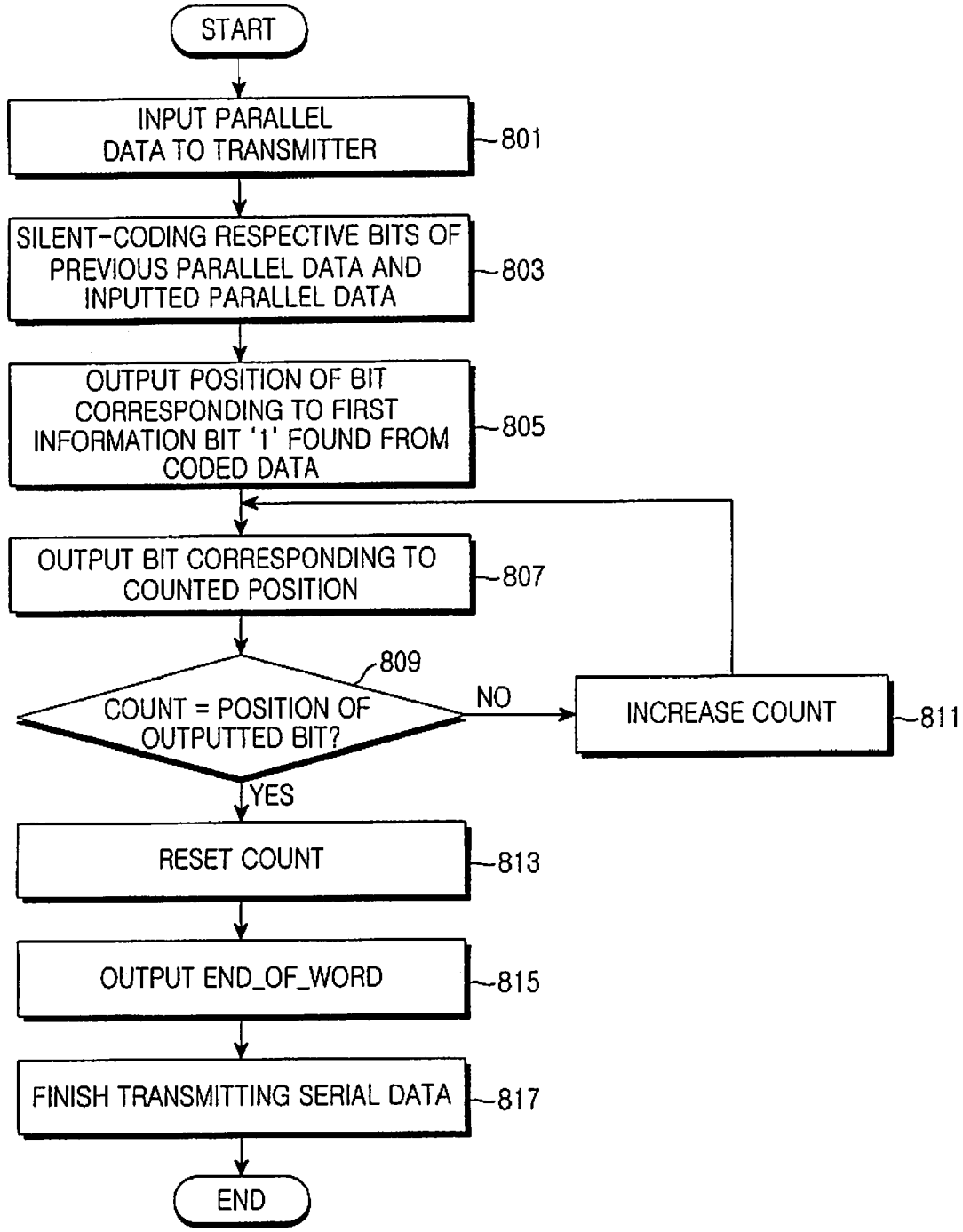
FIG. 8 is a flowchart showing a process for transmitting compressed serial data according to an embodiment of the present invention.

FIG. 8 is a flowchart showing a process for transmitting compressed serial data according to an embodiment of the present invention.

Referring to FIG. 8, when the transmitter 310 receives parallel data in step 801, the coder 313 of the transmitter 310 subjects respective bits of the previous parallel data and the inputted parallel data to SILENT coding in step 803. Then, in step 805, the encoder 401 of the compressor 317 receives the coded parallel data 307, scans respective bits, and determines the position in which the first information bit '1' is found.

In step 807, the serial converter 315 outputs a bit of the coded parallel data 307, which corresponds to the position indicated by the count, based on the serial conversion control signal C1 corresponding to the count. In step 807, in the initial case of the serial communication system, the serial converter 315 outputs a bit corresponding to the position indicated by the initial count value 0.

The comparator 405 confirms in step 809 if the inputted count is identical to the position of the first information bit found. If it is confirmed in step 809 that the inputted count is identical to the position of the first information bit found, the comparator 405 proceeds to step 813; and, if they are different, it proceeds to step 811. In step 811, the first counter 403 increases the count by 1 and transmits the increased count to the serial converter 315 in step 807.

If the count is identical to the position of the first information bit found, the comparator 405 inputs a [HIGH] signal to the first counter 403 in step 813 so that the first counter 403 resets the count. The resetting prevents further transmission of coded data. The comparator 405 outputs a [HIGH] signal as the end_of_word 303 in step 815. Then, the transmitter 310 finishes transmitting compressed serial data 305 in step 817.

Figure 9:
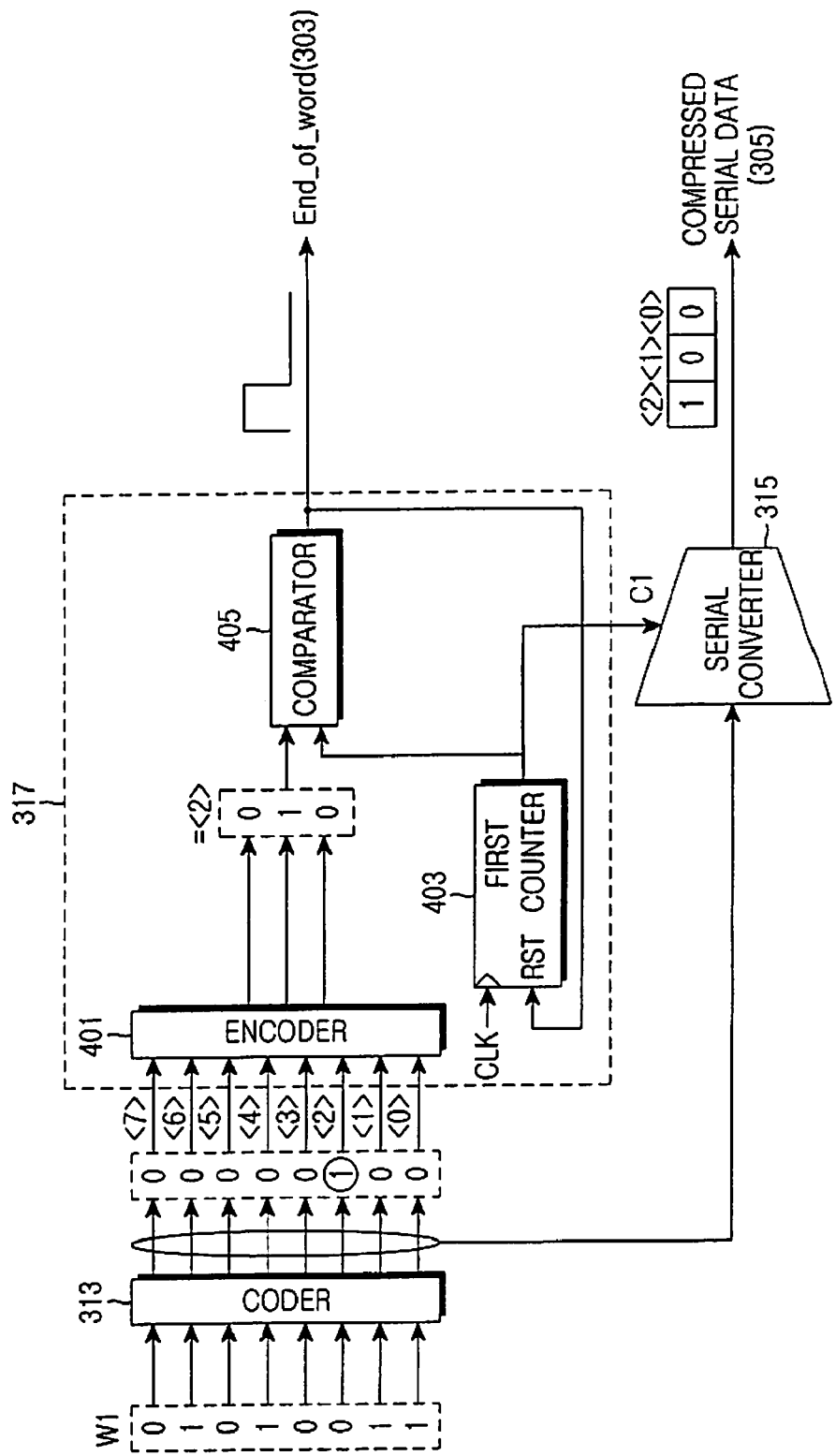
FIG. 9 shows a process for transmitting compressed serial data by a transmitting apparatus according to an embodiment of the present invention.

FIG. 9 shows a process for transmitting compressed serial data by a transmitting apparatus according to an embodiment of the present invention.

Based on an assumption that 8-bit parallel data [01010011] is inputted to the transmitter 310 and that the coder 313 outputs SILENT-coded parallel data [00000100], a process for converting the coded parallel data [00000100] into compressed serial data [100] and transmitting it by the transmitter 310 according to an embodiment of the present invention will now be described.

Referring to FIG. 9, the encoder 401 of the compressor 317 receives [00000100] as an input of the coded parallel data, scans the MSB first, and, based on the finding that the position of the first information bit '1' found corresponds to 2, outputs [010]. The first counter 403 counts [000] and outputs it to the comparator 405 and as the serial conversion control signal C1. The serial converter 315 outputs a bit of the coded data, i.e. [1], which corresponds to the position indicated by the count [000], based on the serial conversion control signal C1 corresponding to the count [000]. The comparator 405 compares the count [000] with the position of the first information bit found, i.e. [010], and, after finding that they are different, outputs a [LOW] signal as the end_of_word 303.

In addition, since the count [000] is different from the position of the first information bit found [010], the first counter 403 increases the count by 1 and outputs the resulting count [001] to the comparator 405 and as the serial conversion control signal C1. The serial converter 315 outputs a bit of the coded data, i.e. [0], which corresponds to the count [001], based on the serial conversion control signal C1 corresponding to the count [001]. The comparator 405 compares the count [001] with the position of the first information bit found [010] and, after finding that they are different, outputs a [LOW] signal as the end_of_word 303.

In addition, since the count [001] is different from the position of the first information bit found [010], the first counter 403 increases the count by 1 and outputs the resulting count [010] to the comparator 405 and as the serial conversion control signal C1. The serial converter 315 outputs a bit of the coded data, i.e. [1], which corresponds to the count [010], based on the serial conversion control signal C1 corresponding to the count [010]. The comparator 405 compares the count [010] with the position of the first information bit found

[010] and, after finding that they are identical, outputs a [HIGH] signal as the end_of_word 303. After receiving the [HIGH] signal from the comparator 405, the first counter 403 resets the count and prevents the upper 5 bits [00000] of the coded parallel data from being transmitted. As such, the transmitter 310 transmits [HIGH-LOW-LOW] as the end_of__word 303 and [100] as the compressed serial data 305 to the receiver 350.

Figure 10:
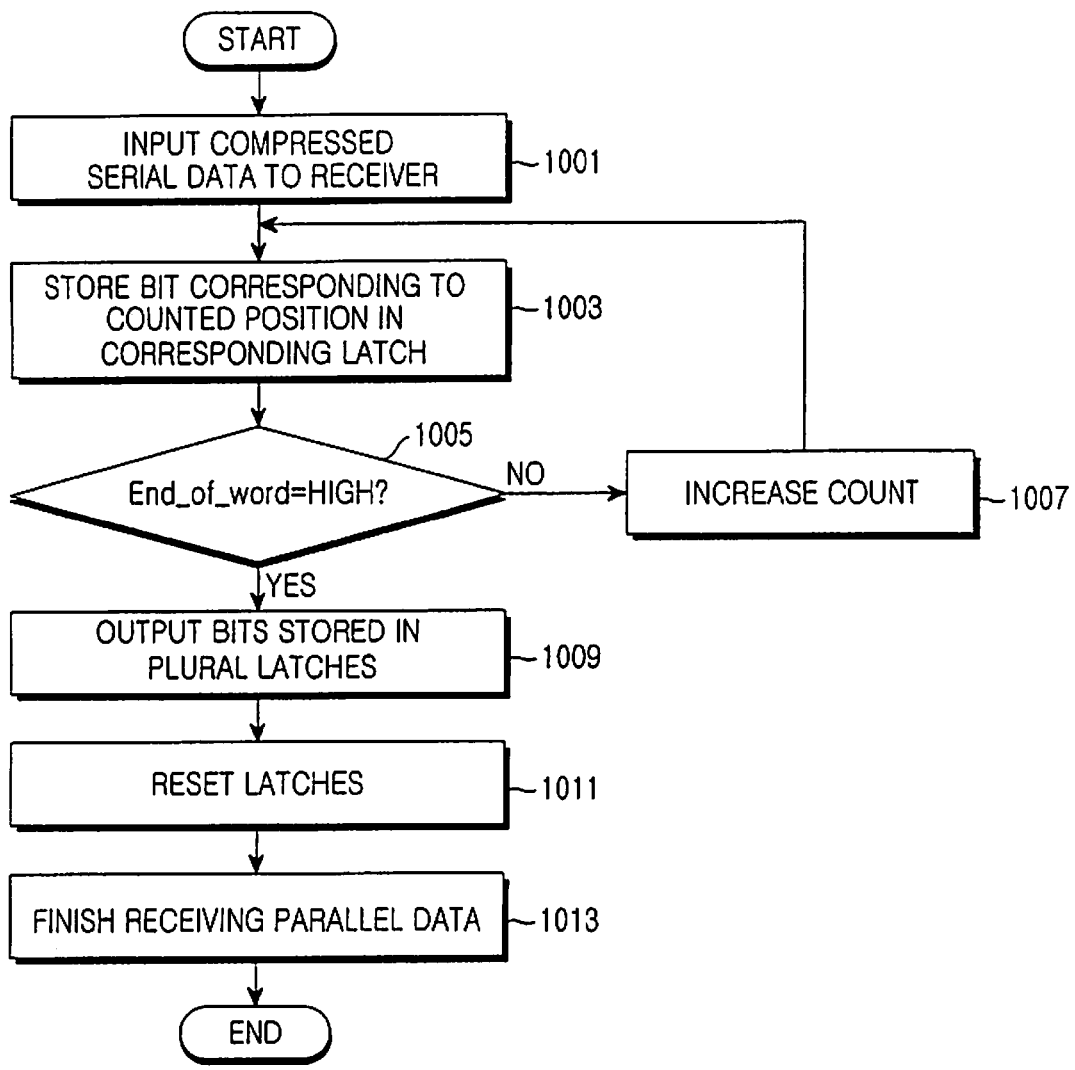
FIG. 10 is a flowchart showing a process for receiving compressed serial data according to an embodiment of the present invention.

FIG. 10 is a flowchart showing a process for receiving compressed serial data according to an embodiment of the present invention.

Referring to FIG. 10, the receiver 350 receives respective bits of compressed serial data 305 from the transmitter 310 in step 1001. The parallel converter 351 stores a bit corresponding to the count in the corresponding latch in step 1003. In the initial case of the serial communication system, in step 1003, the parallel converter 351 stores a bit corresponding to the initial count [0] in the corresponding latch.

The second counter 601 determines if the end_of_word 303 is a [HIGH] signal in step 1005. If the end_of_word 303 is a [HIGH] signal, the second counter 601 proceeds to step 1009 and, in the case of a [LOW] signal, proceeds to step 1007. The second counter 601 increases the count by 1 in step 1007 so that the next bit is stored in the corresponding latch, and proceeds to step 1003.

If the end_of_word 303 is a [HIGH] signal, the parallel converter 351 outputs bits stored in a plurality of latches 703 in step 1009. Those of the latches 703, in which the bit corresponding to the count is not stored, output [0] as a result of the latch reset operation occurred when the previous compressed serial data was received. The parallel converter 351 resets the plurality of latches in step 1011, in order to store the next transmitted serial data. In step 1013, the receiver 350 converts the compressed serial data, which has been transmitted by the transmitter 310, into N-bit coded parallel data 307, decodes it, and finishes receiving the parallel data 309.

Figure 11:
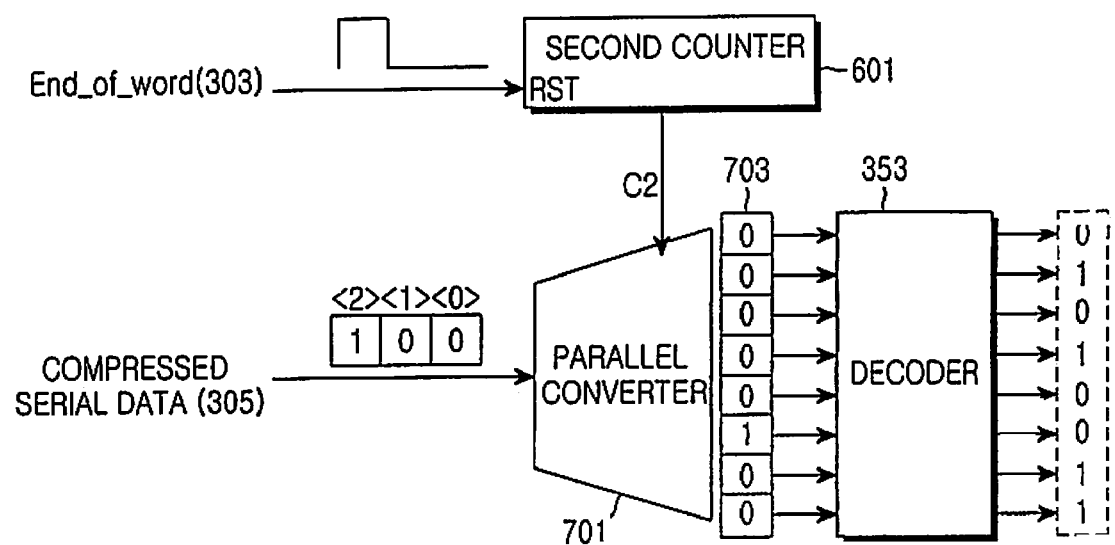
FIG. 11 shows a process for receiving compressed serial data by a receiving apparatus according to an embodiment of the present invention.

FIG. 11 shows a process for receiving compressed serial data by a receiving apparatus according to an embodiment of the present invention.

Based on an assumption that the receiver 350 has received [HIGH-LOW-LOW] (as the end_of_word) and compressed serial data [100] from the transmitter 310 as described with reference to FIG. 9, a process for converting the compressed serial data [100] into parallel data by the receiver 350 according to an embodiment of the present invention will be described.

Referring to FIG. 11, when the receiver 350 receives respective bits of the compressed serial data [100] from the transmitter 310, the second counter 601 of the decompressor 357 included in the receiver 350 counts [000]. The parallel converter 701 stores [0], which is the bit corresponding to the count [000], in the latch 0. Since the end_of_word 303 is a [LOW] signal in the case of the count [000], the second counter 601 increases the count by 1 in order to store the next bit in the corresponding latch.

The next bit stored in the parallel converter 701 is [0], which is the bit corresponding to the increased count [001], in the latch 1. Since the end_of_word 303 is a [LOW] signal in the case of the count [001], the second counter 601 increases the count by 1.

The next bit stored in the parallel converter 701 is [1], which is the bit corresponding to the increased count [010], in the latch 1. Since the end_of_word 303 is a [HIGH] signal in the case of the count [010], the second counter 601 outputs respective bits [00000100] stored in a plurality of latches. Those of the latches, in which the bit corresponding to the count is not stored, i.e. latches 3-7 output 0 as a result of the latch reset operation occurred when the previous serial data was received. The parallel converter 351 resets the plurality of latches in order to store the next transmitted serial data.

The receiver 350 decodes the coded parallel data 307, i.e. bits [00000100] outputted by the plurality of latches 703, and finishes receiving the initially transmitted parallel data [01010011].

As mentioned above, the present invention compresses serial data by removing 0 bits resulting from SILENT coding.

A detailed comparison to a prior art run-length code scheme is now described to further illustrate the advantages of the present invention. According to the run-length scheme, when the same value is repeated consecutively on a serial data stream, the overall stream amount is reduced by writing the number of repetition and the corresponding value only once. For example, in the case of a stream [AAAAAAAAAAAA-BAAAAAAAAAAAAABBBAAAAAA-BAAAAAAAAAA], the corresponding run-length code is [12]A B[13]A[3]B[6]AB[10]A, which is a combination of numbers and symbols (each number denotes the number of repetition of the symbol). The run-length code scheme is basically adapted to a stream of characters, not binary numbers, and is effective when the stream is long and when characters are repeated consecutively a large number of times.

In the case of the 8-bit data [00000100] described with reference to FIGS. 9 and 11, the corresponding run-length code is [5]01[2]0. If this is expressed in terms of binary digits, there is unclear distinction between the numbers and symbols because both of them are expressed in terms of binary digits. Particularly, the binary expression is [101010100]. This binary data exceeds 8 bits, and this information alone cannot be decoded. If a method for differentiating the numbers and symbols in the run-length code (e.g. conversion to ASCII character codes) is employed, the total bit number substantially exceeds 8 bits. In summary, the run-length code is inefficient to use when a relative small unit of data (e.g. 8 bit, 32 bit, 64 bit) is transmitted at a high rate, unlike the present invention.

As mentioned above, the present invention is advantageous in that, when parallel data is converted into serial data and transmitted in a serial communication system, a conventional coding scheme is used to reduce the number of bit transitions and minimize the dynamic power consumed during the transmission.

In addition, a compression coding scheme is adopted to reduce the amount of transmission and shorten the transmission time. This makes it possible to transmit a larger amount of data in the same amount of time and increases the effective transmission bandwidth.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for converting coded parallel data into serial data and transmitting the serial data in a serial communication system, the method comprising the steps of:

determining a position, wherein an information bit of the coded parallel data being found first, the information bit being defined as a bit having a predetermined bit value so that the information bit is not compressed; and serially transmitting the information bit found first and at least one bit following the information bit found first as compressed serial data until the determined position is reached.

2. The method as claimed in claim 1, wherein, in the determining step, a Most Significant Bit (MSB) of the coded parallel data is scanned first to determine the position, the information bit being found first in the position.

3. The method as claimed in claim 2, wherein, when the information bit found first is transmitted while transmitting the compressed serial data, a signal indicating an end of the compressed serial data is transmitted.

4. The method as claimed in claim 1, wherein the coded parallel data is parallel data subjected to a SILENT-coding by means of XOR operation of respective bits of previously transmitted parallel data and currently transmitted parallel data.

5. A method for convening serial data into coded parallel data and receiving the coded parallel data in a serial communication system, the method comprising the steps of:
    outputting an increasing count until a signal indicating an end of compressed serial data is input;
    receiving each bit of the compressed serial data and storing a bit corresponding to the outputted count, in a corresponding latch; and
    outputting bits stored in a plurality of latches as the coded parallel data when the signal indicating the end of the compressed serial data is input.

6. The method as claimed in claim 5, wherein, in the receiving step, each received bit is stored in a corresponding latch of latches as many as a size of the coded parallel data, the latches being initially set based on the bit value.

7. The method as claimed in claim 5, wherein the coded parallel data is parallel data subjected to a SILENT-coding by means of XOR operation of respective bits of previously transmitted parallel data and currently transmitted parallel data.

8. An apparatus for converting coded parallel data into serial data and transmitting the serial data in a serial communication system, the apparatus comprising:
    a compressor for outputting a count while increasing the count until a position is reached, wherein an information bit of the coded parallel data being found first, the information bit being defined as a bit having a predetermined bit value so that the information bit is not compressed, the compressor transmitting a signal indicating an end of compressed serial data when the position is reached; and
    a serial converter for serially transmitting a bit of the coded parallel data as the compressed serial data, the bit corresponding to a position indicated by the outputted count.

9. The apparatus as claimed in claim 8, wherein the compressor comprises:
    an encoder for determining the position of the information bit found first in the coded parallel data;
    a counter for outputting the count while increasing the count until the position of the information bit found first is reached; and
    a comparator for resetting the counter and outputting a signal indicating an end of the compressed serial data when the count reaches the position of the information bit found first.

10. The apparatus as claimed in claim 9, wherein the encoder is adapted to scan an MSB of the coded parallel data first to determine the position of the information bit found first.

11. The apparatus as claimed in claim 9, wherein the serial converter comprises a multiplexer adapted to receive the coded parallel data as an input and serially transmit a bit in a position corresponding to the outputted count.

12. The apparatus as claimed in claim 8, wherein the coded parallel data is parallel data subjected to a SILENT-coding by means of XOR operation of respective bits of previously transmitted parallel data and currently transmitted parallel data.

13. An apparatus for converting serial data into coded parallel data and receiving the coded parallel data in a serial communication system, the apparatus comprising:
    a decompressor for outputting a count while increasing the count until a signal indicating an end of compressed serial data is input; and
    a parallel converter having a plurality of latches pre-storing predetermined bit values, the parallel converter receiving each bit of the compressed serial data and storing a bit corresponding to the outputted count in a corresponding latch, the parallel converter outputting bits stored in the latches as the coded parallel data when a signal indicating an end of the compressed serial data is inputted.

14. The apparatus as claimed in claim 13, wherein the coded parallel data is parallel data subjected to a SILENT-coding by means of XOR operation of respective bits of previously transmitted parallel data and currently transmitted parallel data.

15. A serial communication system for converting coded parallel data into serial data and transmitting/receiving the serial data, the system comprising:
    a serial data transmitting apparatus for outputting a first count while increasing the first count until a position is reached, wherein an information bit of the coded parallel data being found first, the information bit being defined as a bit having a predetermined bit value so that the information bit is not compressed, the serial data transmitting apparatus transmitting a signal indicating an end of compressed serial data when the position is reached, the serial data transmitting apparatus serially transmitting a bit of the coded parallel data as the compressed serial data, the bit corresponding to a position indicated by the output first count; and
    a serial data receiving apparatus for outputting a second count while increasing the second count until a signal indicating an end of the compressed serial data is input, the serial data receiving apparatus having a plurality of latches having predetermined bit values, the serial data receiving apparatus receiving each bit of the compressed serial data and storing a bit corresponding to the second count in a corresponding latch, the serial data receiving apparatus outputting bits stored in the latches as the coded parallel data when a signal indicating an end of the compressed serial data is input.

16. The system as claimed in claim 15, wherein the serial data transmitting apparatus comprises:
    a compressor for outputting the first count while increasing the first count until a position is reached, an information bit of the coded parallel data being found first in the position, the compressor transmitting a signal indicating an end of the compressed serial data when the position is reached; and
    a serial converter for serially transmitting a bit of the coded parallel data as the compressed serial data, the bit corresponding to a position indicated by the output first count.

17. The system as claimed in claim 16, wherein the compressor comprises:
- an encoder for determining the position of the information bit found first in the coded parallel data;
- a counter for outputting the first count while increasing the first count until the position of the information bit found first is reached; and
- a comparator for resetting the counter and outputting a signal indicating an end of the compressed serial data when the first count reaches the position of the information bit found first.

18. The system as claimed in claim 17, wherein the encoder is adapted to scan an MSB of the coded parallel data first to determine the position of the information bit found first.

19. The system as claimed in claim 17, wherein the serial convener comprises a multiplexer adapted to receive the coded parallel data as an input and serially transmit a bit in a position corresponding to the outputted first count.

20. The system as claimed in claim 15, wherein the serial data receiving apparatus comprises:
- a decompressor for outputting the second count while increasing the second count until a signal indicating an end of compressed serial data is inputted; and
- a parallel converter for receiving each bit of the compressed serial data and storing a bit corresponding to the output second count in a corresponding latch, the parallel convener outputting bits stored in the latches as the coded parallel data when a signal indicating an end of the compressed serial data is input.

21. The system as claimed in claim 15, wherein the coded parallel data is parallel data subjected to a SILENT-coding by means of XOR operation of respective bits of previously transmitted parallel data and currently transmitted parallel data.

* * * * *